United States Patent
Houchin-Miller (10) Patent No.: US 9,494,652 B2
(45) Date of Patent: Nov. 15, 2016

(54) VOLTAGE AND TEMPERATURE SENSING OF BATTERY CELL GROUPS

(71) Applicant: Johnson Controls Technology Company, Holland, MI (US)

(72) Inventor: Gary P. Houchin-Miller, Milwaukee, WI (US)

(73) Assignee: Johnson Controls Technology Company, Holland, MI (US)

( * ) Notice: Subject to any disclaimer, the term of this patent is extended or adjusted under 35 U.S.C. 154(b) by 415 days.

(21) Appl. No.: 13/741,005

(22) Filed: Jan. 14, 2013

(65) Prior Publication Data

US 2013/0193977 A1    Aug. 1, 2013

Related U.S. Application Data (60) Provisional application No. 61/593,234, filed on Jan. 31, 2012.

(51) Int. Cl.
| | |
|---|---|
| *G01N 27/416* | (2006.01) |
| *G01R 31/36* | (2006.01) |
| *H01M 2/10* | (2006.01) |
| *H01M 2/20* | (2006.01) |
| *H01M 10/42* | (2006.01) |
| *H01M 10/48* | (2006.01) |

(52) U.S. Cl.
CPC ......... *G01R 31/3606* (2013.01); *G01R 31/362* (2013.01); *G01R 31/3658* (2013.01); *H01M 2/1077* (2013.01); *H01M 2/206* (2013.01); *H01M 10/425* (2013.01); *H01M 10/482* (2013.01); *H01M 10/486* (2013.01)

(58) Field of Classification Search
CPC ....................................................... G01R 31/36
USPC ......................................................... 324/434
See application file for complete search history.

(56) References Cited

U.S. PATENT DOCUMENTS

| | | | |
|---|---|---|---|
| 2002/0182480 A1* | 12/2002 | Hanauer et al. | ................. 429/62 |
| 2004/0227490 A1* | 11/2004 | MacNair, Jr. | ......... H02J 7/0075 320/132 |
| 2006/0091891 A1 | 5/2006 | Woo et al. | |
| 2009/0130545 A1 | 5/2009 | Wood et al. | |
| 2010/0047682 A1* | 2/2010 | Houchin-Miller | .. H01M 2/1077 429/120 |
| 2011/0049342 A1 | 3/2011 | Tsao et al. | |
| 2011/0104533 A1* | 5/2011 | Seto | ................................ 429/90 |
| 2011/0148426 A1* | 6/2011 | Yokotani | ....................... 324/434 |
| 2011/0210703 A1* | 9/2011 | Souza et al. | .................. 320/136 |

(Continued)

FOREIGN PATENT DOCUMENTS

| | | | |
|---|---|---|---|
| EP | 1333521 A2 * | 8/2003 | |
| WO | 2007/102671 A1 | 9/2007 | |
| WO | WO 2007102671 | * | 9/2007 |

OTHER PUBLICATIONS

International Search Report and Written Opinion for PCT Application No. PCT/US2013/021574 dated Apr. 5, 2013, 15 pgs.

*Primary Examiner* — Robert Grant (74) *Attorney, Agent, or Firm* — Fletcher Yoder, P.C.

(57) ABSTRACT

The embodiments described herein include a system and a method. One embodiment provides a sensing apparatus for a battery system having a plurality of cells. The sensing apparatus includes an elongated substrate configured to extend along one side of the plurality of cells and a plurality of sensors, each corresponding to a respective one of the plurality of cells, and each configured to contact its respective cell.

20 Claims, 6 Drawing Sheets

(56) References Cited

U.S. PATENT DOCUMENTS

2011/0269008 A1* 11/2011 Houchin-Miller .. B60L 11/1874
 429/120
2011/0300433 A1* 12/2011 Kim .............................. 429/159

* cited by examiner

VOLTAGE AND TEMPERATURE SENSING OF BATTERY CELL GROUPS

CROSS REFERENCE TO RELATED APPLICATIONS

This application is a Non-Provisional Application of U.S. Provisional Patent Application No. 61/593,234, entitled "Voltage and Temperature Sensing of Prismatic Battery Cell Groups," filed Jan. 31, 2012, which is herein incorporated by reference in its entirety for all purposes.

BACKGROUND

The present application relates generally to the field of batteries and battery systems. More specifically, the present application relates to batteries and battery systems that may be used in vehicle applications to provide at least a portion of the motive power for the vehicle.

Vehicles using electric power for all or a portion of their motive power (e.g., electric vehicles (EVs), hybrid electric vehicles (HEVs), plug-in hybrid electric vehicles (PHEVs), and the like, collectively referred to as "electric vehicles") may provide a number of advantages as compared to more traditional gas-powered vehicles using internal combustion engines. For example, electric vehicles may produce fewer undesirable emission products and may exhibit greater fuel efficiency as compared to vehicles using internal combustion engines (and, in some cases, such vehicles may eliminate the use of gasoline entirely, as is the case of certain types of PHEVs).

As electric vehicle technology continues to evolve, there is a need to provide improved power sources (e.g., battery systems or modules) for such vehicles. For example, it is desirable to increase the lifespan of the batteries used in the vehicles. It is also desirable to improve the performance of such batteries and to reduce the cost associated with the battery systems.

One area of improvement is the monitoring of the battery systems. Sensors in the battery systems may monitor the voltage and/or the temperature of the batteries, which enable improved management of the battery system. However, placement of these sensors may affect the ease and cost of manufacturing the battery systems. Hence, it would be desirable to provide an improved battery module and/or system for use in electric vehicles that addresses one or more challenges associated with the battery systems used in such vehicles. It also would be desirable to provide a battery module and/or system that includes any one or more of the advantageous features that will be apparent from a review of the present disclosure.

SUMMARY

One embodiment provides a sensing apparatus for a battery system having a plurality of cells. The sensing apparatus includes an elongated substrate configured to extend along one side of the plurality of cells and a plurality of sensors, each corresponding to a respective one of the plurality of cells, and each configured to contact its respective cell.

Another embodiment provides a battery system configured to provide motive power for a vehicle. The battery system includes a battery cell group comprising a plurality of cells and a sensing apparatus. The sensing apparatus includes an elongated substrate configured to extend along one side of the battery cell group and a plurality of sensors, each corresponding to a respective one of the plurality of cells in the battery cell group, and each configured to contact its respective cell.

Another embodiment provides a method including connecting a bus bar across a plurality of battery cells to form a battery cell group and coupling a sensing apparatus along a side of the battery cell group different from the bus bar. The sensing apparatus includes a plurality of sensors each corresponding to a respective one of the plurality of cells in the battery cell group, and each configured to contact its respective cell.

BRIEF DESCRIPTION OF THE DRAWINGS

Advantages of the disclosed techniques may become apparent upon reading the following detailed description and upon reference to the drawings in which.

DETAILED DESCRIPTION

One or more specific embodiments of the present techniques will be described below. In an effort to provide a concise description of these embodiments, not all features of an actual implementation are described in the specification. It should be appreciated that in the development of any such actual implementation, as in any engineering or design project, numerous implementation-specific decisions must be made to achieve the developers' specific goals, such as compliance with system-related and business-related constraints, which may vary from one implementation to another. Moreover, it should be appreciated that such a development effort might be complex and time consuming, but would nevertheless be a routine undertaking of design, fabrication, and manufacture for those of ordinary skill having the benefit of this disclosure.

The present disclosure is generally directed towards battery systems in vehicles using electric power for all or a portion of their motive force, such as electric vehicles (EVs), hybrid electric vehicles (HEVs), or plug-in hybrid electric vehicles (PHEVs). The battery systems may include multiple battery cells, which forms a battery cell group, to supply voltage to a vehicle. Because the lifespan of each battery cell may correlate with parameters such as temperature and voltage, the battery system may monitor such parameters.

Accordingly, one embodiment of the present disclosure provides a battery system configured to provide motive power for a vehicle including a battery cell group comprising at least two battery cells with a positive terminal and a negative terminal, in which a bus bar couples the positive terminal of a first battery cell to the negative terminal of a second battery cell. The battery system further includes a sensing apparatus coupled to the battery cell group separate from the bus bar, wherein the sensing apparatus includes at least one sensor configured to monitor operational parameters of the battery cell group.

Figure 1:
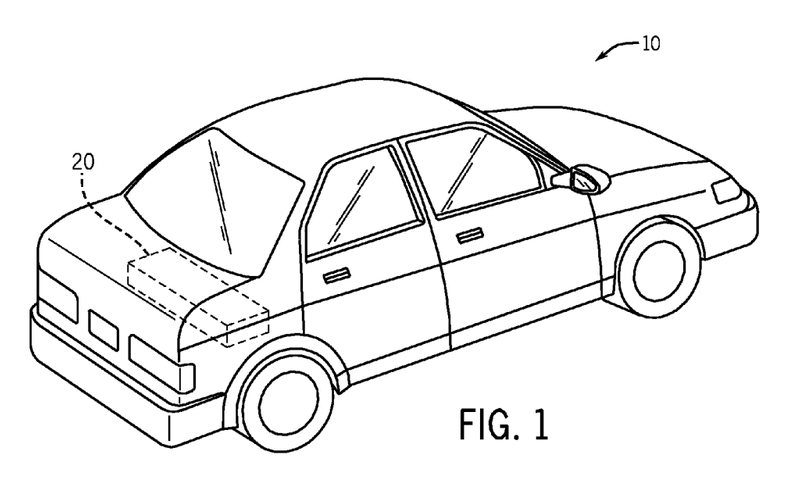
FIG. 1 is a perspective view of a vehicle including a battery system according to one embodiment.

By way of introduction, FIG. 1 is a perspective view of a vehicle 10 in the form of an automobile (e.g., a car) having a battery system 20 for providing all or a portion of the motive power for the vehicle 10. Such a vehicle 10 can be an xEV, where the term "xEV" is defined herein to include all of the following vehicles, or any variations or combinations thereof, that use electric power for all or a portion of their vehicular motive force. As will be appreciated by those skilled in the art, hybrid electric vehicles (HEVs) combine an internal combustion engine propulsion system and a battery-powered electric propulsion system. The term HEV may include any variation of a hybrid electric vehicle, such as micro-hybrid and mild hybrid systems, which disable the internal combustion engine when the vehicle is idling and utilize a battery system to continue powering the air conditioning unit, radio, or other electronics, as well as to kick-start the engine when propulsion is desired. The mild hybrid system may apply some level of power assist to the internal combustion engine, whereas the micro-hybrid system may not supply power assist to the internal combustion engine. A plug-in electric vehicle (PEV) is any vehicle that can be charged from an external source of electricity, such as wall sockets, and the energy stored in the rechargeable battery packs drives or contributes to drive the wheels. PEVs are a subcategory of electric vehicles that include all-electric or battery electric vehicles (BEVs), plug-in hybrid vehicles (PHEVs), and electric vehicle conversions of hybrid electric vehicles and conventional internal combustion engine vehicles.

Although the vehicle 10 is illustrated as a car in FIG. 1, the type of vehicle may differ according to other embodiments, all of which are intended to fall within the scope of the present disclosure. For example, the vehicle 10 may be a truck, bus, industrial vehicle, motorcycle, recreational vehicle, boat, or any other type of vehicle that may benefit from the use of electric power for all or a portion of its propulsion power. Moreover, the battery system 20 may also be useful beyond the application of xEVs. For example, the battery system 20 may be suitable for energy storage applications, where the battery system 20 may act as energy storage for an alternative energy source, such as, a wind turbine or a solar panel, for example. Further applications of the battery system 20 may include additional battery modules, stationary power devices, portable battery modules, battery modules for HVAC systems, and use as an uninterruptable power supply, among other things.

Although the battery system 20 is illustrated in FIG. 1 as being positioned in the trunk or rear of the vehicle, according to other embodiments, the location of the battery system 20 may differ. For example, the position of the battery system 20 may be selected based on the available space within a vehicle, the desired weight balance of the vehicle, the location of other components used with the battery system 20 (e.g., battery management systems, vents or cooling devices, etc.), and a variety of other considerations.

Figure 2:
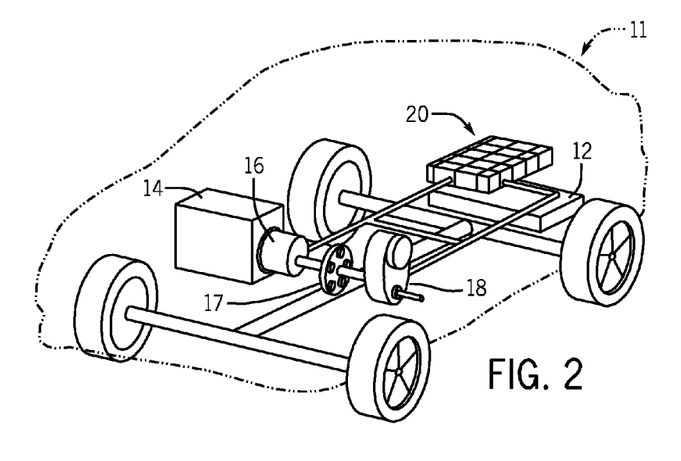
FIG. 2 is a cutaway schematic view of the vehicle of FIG. 1 including a battery system according to one embodiment.

FIG. 2 illustrates a cutaway schematic view of the vehicle 11 provided in the form of an HEV according to one embodiment. A battery system 20 is provided toward the rear of the vehicle 11 proximate a fuel tank 12 (the battery system 20 may be provided immediately adjacent the fuel tank 12 or may be provided in a separate compartment in the rear of the vehicle 11 (e.g., a trunk) or may be provided elsewhere in the vehicle 11). An internal combustion engine 14 is provided for times when the vehicle 11 utilizes gasoline power to propel the vehicle 11. An electric motor 16, a power split device 17, and a generator 18 are also provided as part of the vehicle drive system.

Such a vehicle 11 may be powered or driven by just the battery system 20, by just the engine 14, or by both the battery system 20 and the engine 14. It should be noted that other types of vehicles and configurations for the vehicle drive system may be used according to other embodiments, and that the schematic illustration of FIG. 2 should not be considered to limit the scope of the subject matter described in the present application. According to various other embodiments, the size, shape, and location of the battery system 20, the type of vehicle 11, the type of vehicle technology (e.g., EV, HEV, PHEV, etc.), and the battery chemistry, among other features, may differ from those shown or described.

According to one embodiment, the battery system 20 includes a plurality cells or a battery cell group. The battery system 20 may also include features or components for connecting the cells to each other and/or to other components of the vehicle electrical system, and also for regulating the electrochemical cells and other features of the battery system 20. For example, the battery system 20 may include features that are responsible for monitoring and controlling the electrical performance of the battery system 20, managing the thermal behavior of the battery system 20, containment and/or routing of effluent (e.g., gases that may be vented from an electrochemical cell through a vent), and other aspects of the battery system 20.

Figure 3:
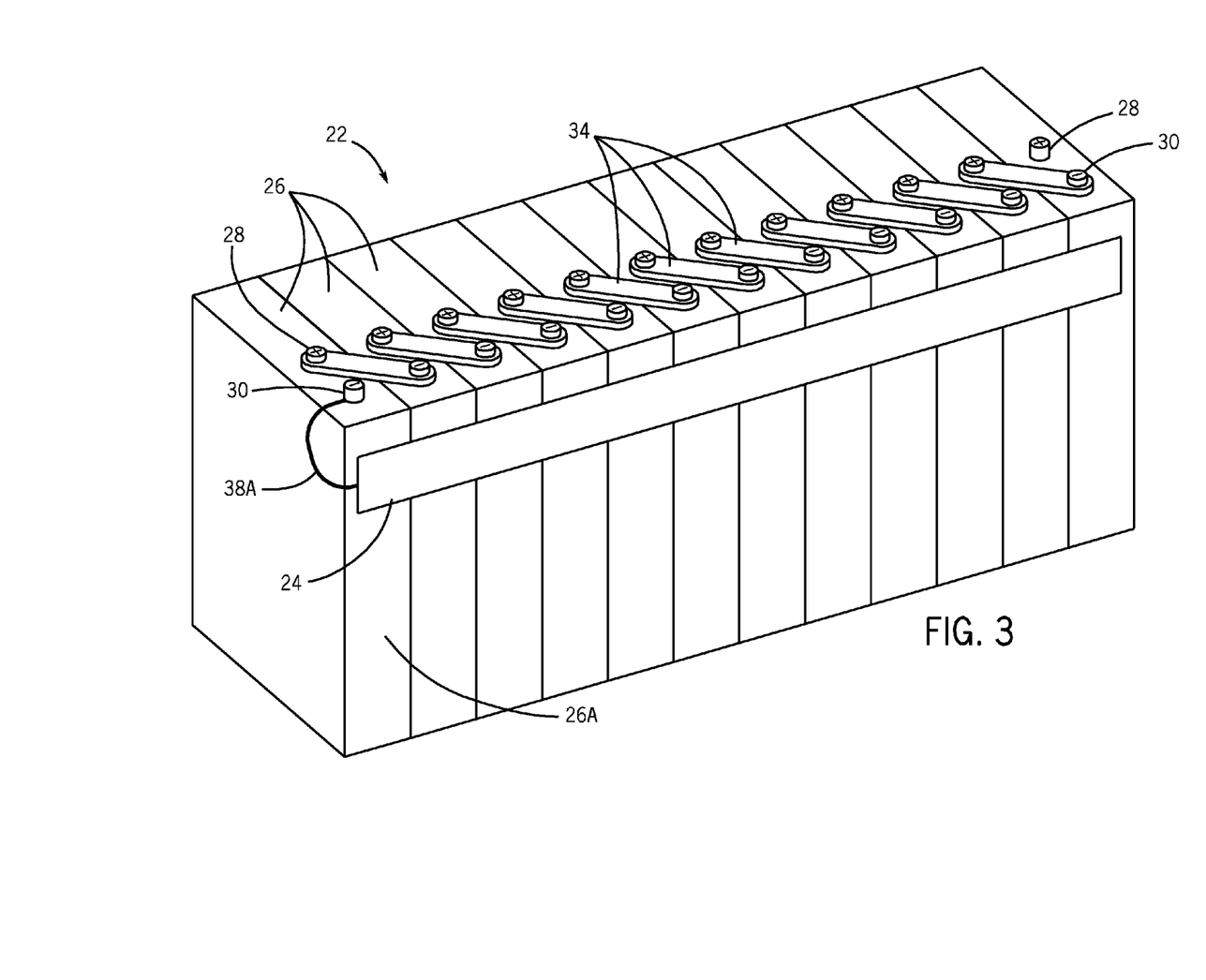
FIG. 3 is a partial perspective view of a battery cell group with a sensing apparatus according to one embodiment.

FIG. 3 illustrates one embodiment of the battery cell group 22 with a sensing apparatus 24 configured to monitor the battery cell group 22. As shown in FIG. 3, the battery cell group 22 is a prismatic battery cell group made up of multiple battery cells 26. Other embodiments may have different cell configurations, such as oval, polygon, or cylindrical. The battery cells may be a rechargeable battery such as nickel-metal-hydride (NiMH) batteries or lithium-ion batteries. In the depicted embodiment, each cell 26 has a positive 28 and a negative terminal 30. In each of the cells 26, except a first cell/end cell 26A, the positive terminal 28 is coupled to the previous negative terminal 30 by bus bars 34 to form the battery cell group 22. Thus, the battery cells 26 are connected in series to provide a higher voltage to the vehicle 10.

In the battery system 20, monitoring parameters such as voltage and temperature may help improve the longevity and/or performance of the battery system 20. As described above, the cells 26 in FIG. 3 are connected in series, and in some embodiments, the cells 26 are configured to each provide a substantially similar voltage. However, at times, some cells 26 may provide a higher voltage than the other cells 26, which is undesirable because cells 26 that produce a higher voltage tend to be higher temperature; the higher the temperature of the cell 26, the shorter the lifespan. Accordingly, the sensing apparatus 24 may be configured to monitor parameters of the battery cell group 22 with various sensors. For example, the sensing apparatus 24 may include a voltage sensor to measure the voltage across each cell 26. Other sensors may also be included in the sensing apparatus 24, such as temperature sensors or current sensors.

In addition, as shown in FIG. 3, the sensing apparatus 24 is an elongated substrate coupled to the side of the battery cell group 22 and is separate from the positive terminals 28, the negative terminals 30, and the bus bars 34. Utilizing the separate sensing apparatus 24 may improve manufacturing efficiency and reduce cost. In some embodiments, the sensing apparatus 24 may be a flex circuit coupled to the battery cell group 22 by an adhesive and the bus bars 34 may be laser welded to between the positive terminals 28 and the negative terminals 30. Comparatively, if a sensing apparatus monitors voltage of each cell 26 by coupling to the positive terminals 28 and negative terminals 30 via a spring clamp, it may be difficult to weld the bus bars 34 to the terminals 28 and 30 because the high welding temperature may affect the performance of the sensors. Thus, the separate placement of the sensing apparatus 24 may reduce cost and improve manufacturing efficiency by facilitating the welding of the bus bars 34 across the cell terminals 28 and 30. In other embodiments, the sensing apparatus 24 may be located along any side of the battery cell group 22, such as the bottom, as long as the sensing apparatus 24 is capable of making measurements on each of the cells 26.

Figure 4A:
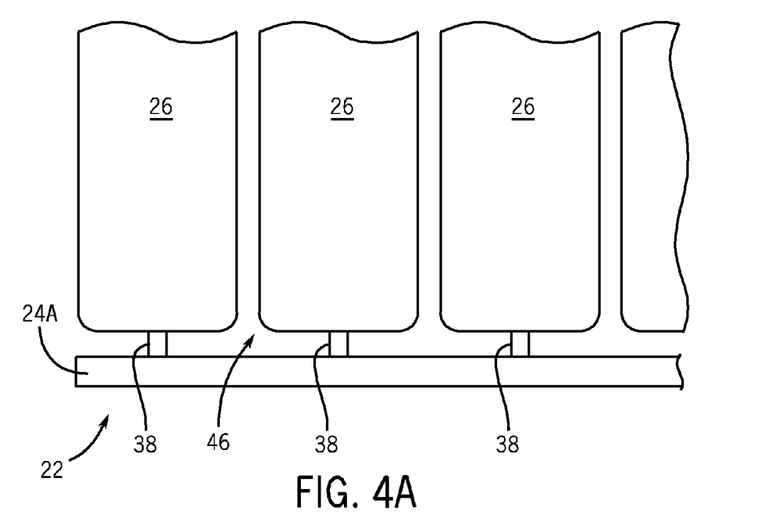
FIG. 4A is a partial top view of the battery cell group of FIG. 3 with a voltage sensing apparatus.

FIG. 4A illustrates a top view of the battery cell group 22 described in FIG. 3 with one embodiment of the sensing apparatus 24. As illustrated, a sensing apparatus 24A includes voltage sensors 38. Accordingly, the voltage sensors 38 included in the sensing apparatus 24A may be configured to measure the voltage at the positive terminal 28 of each adjacent cell 26. A voltage across each cell 26 may be calculated by comparing the voltage readings from adjacent cells 26 because, as depicted in FIG. 3, the positive terminals 28 of the cells 26, except the first cell 26A, is coupled to the negative terminal 30 of the previous cell 26 via the bus bars 34. To find the voltage across the first cell 26A, an additional sensor 38A is attached to the negative terminal 30 of the first cell 26. Thus, the sensing apparatus 24A may have N+1 voltage sensors 38 where N is the number cells 26 in the battery cell group 22. For example, in the embodiment depicted in FIG. 3, the sensing apparatus 24A would have thirteen voltage sensors 38.

Figure 4B:
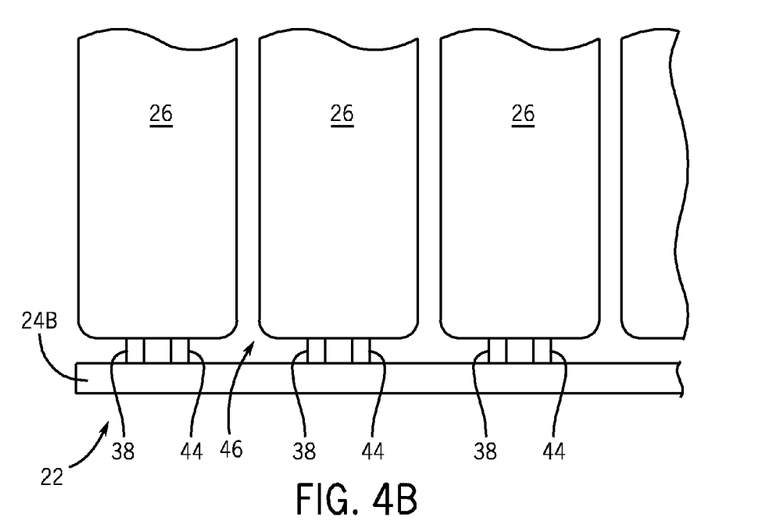
FIG. 4B is a top view of the battery cell group of FIG. 3 with a voltage and temperature sensing apparatus.

FIG. 4B illustrates a top view of the battery cell group 22 described FIG. 3 with another embodiment of the sensing apparatus 24. As illustrated, a sensing apparatus 24B includes voltage sensors 38 and temperature sensors 44. Thus, in addition to being configured to measure the voltage across each cell 26, the sensing apparatus 24B may be configured to measure the temperature of each cell 26. Accordingly, the sensing apparatus 24B may include voltage sensors 38 configured to measure the voltage at the positive terminal 28 of each cell 26 as described above, as well as temperature sensors 44 configured to measure the temperature of each cell 26. The temperature sensors 44 may be thermistors or thermocouples, for example. As depicted, the sensing apparatus 24B includes one temperature sensor 44 for each cell 26. Thus, in the embodiment depicted in FIG. 3, the sensing apparatus 24B would have twelve temperature sensors 44 along with the thirteen voltage sensors 38.

As described above, the sensing apparatus 24 may be a flex circuit, which may be coupled to the cells 26 by an adhesive. Accordingly, the area 46 between the cells 26 and the sensing apparatus 24 and around the sensors (e.g. voltage sensors 38 and/or temperature sensors 44) may contain an adhesive such as glue. In addition, it should be appreciated that multiple sensing apparatus 24 may be used to monitor the battery cell group 22. In other words, one sensing apparatus 24 with voltage sensors 38 may be used in conjunction with a separate sensing apparatus 24 with temperature sensors 44 to monitor both the temperature and the voltage of the battery cell group 22.

Figure 5A:
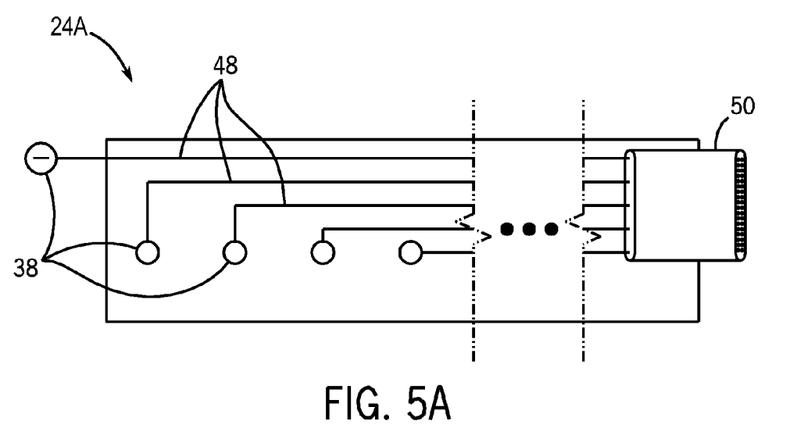
FIG. 5A is a schematic view of the voltage sensing apparatus of FIG. 4A.

FIG. 5A illustrates a schematic view of one embodiment of the sensing apparatus 24A with voltage sensors 38 in FIG. 4A. As described above, the sensing apparatus 24A may include voltage sensors 38 to monitor the voltage across each cell 26, and each voltage sensor 38 may be may be configured to transmit the measurements separately. Accordingly, the voltage sensors 38 may be coupled to individual conductors 48. As illustrated, the individual conductors 48 are then combined into a terminal or connector 50. The terminal or connector 50 may be configured to communicate the measured voltages to a battery management unit (not shown) for further computation. These computations may then be used by the battery management unit to better manage the operation of the battery cell group 22.

Figure 5B:
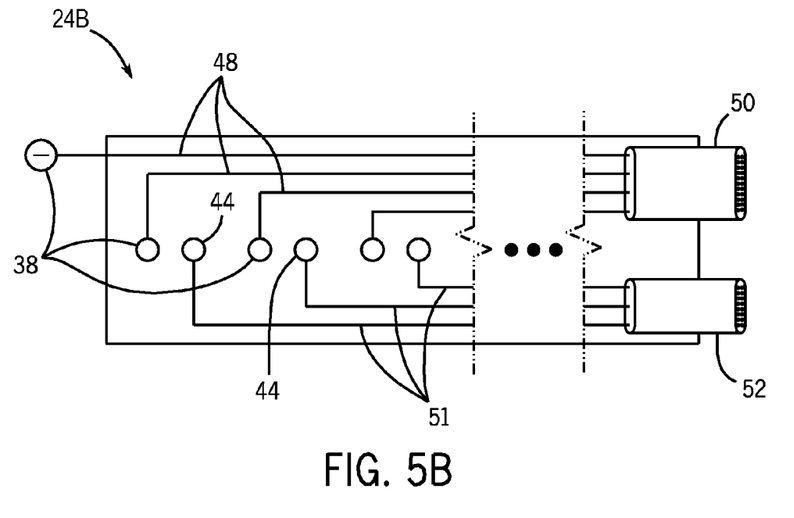
FIG. 5B is a schematic view of the voltage and temperature sensing apparatus of FIG. 4B.

FIG. 5B illustrates a schematic view of one embodiment of the sensing apparatus 24B with temperature sensors 44 and voltage sensors 38 in FIG. 4B. As described above, the sensing apparatus 24B may include voltage sensors 38 to monitor the voltage across each cell 26 and temperature sensors 44 to monitor the temperature of each cell 26. As in the sensing apparatus 24A described above, the voltage sensors 38 may be configured to transmit measurements separately through individual conductors 48, which may then be combined into a terminal or connector 50. Similarly, the temperature sensors 44 may be configured to transmit temperature measurements separately through individual conductors 51, which may be combined into a second terminal or connector 52. Alternatively, the conductors 48 and 51 may be grouped into a single terminal or connector 50 or 52. Terminals or connectors 50 and/or 52 may be configured to communicate the measured voltages and temperatures to the battery management unit for further computation. The temperature measurements and voltage measurements may be used individually or in conjunction with other parameters to better manage the operation of the battery cell group 22. As described above, the lifespan of the battery system 20 may be increased by ensuring that each cell 26 produces substantially the same voltage and has substantially the same temperature.

Figure 6:
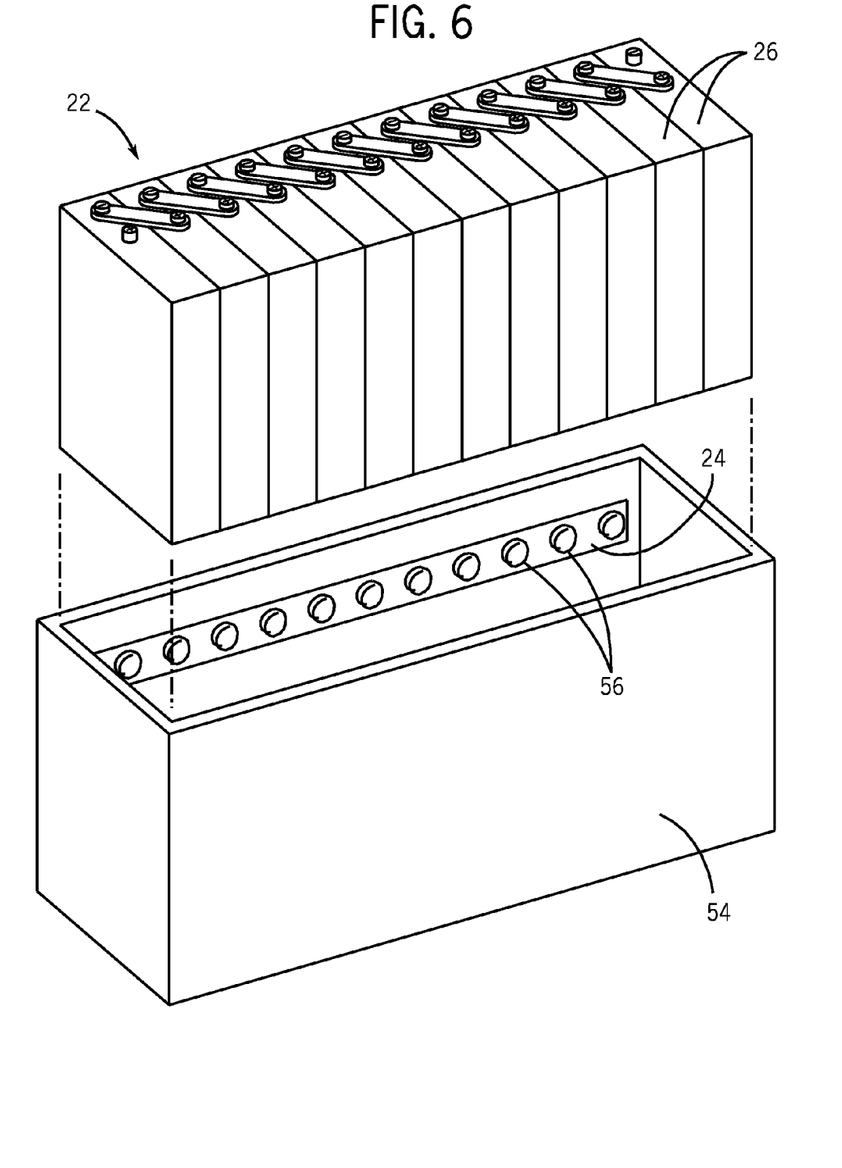
FIG. 6 is a partially exploded view of an alternate embodiment of the battery cell group with a sensing apparatus.

FIG. 6 illustrates a partially exploded view of an alternate embodiment of the sensing apparatus 24. As illustrated, instead of the sensing apparatus 24 being adhesively coupled to the battery cell group 22, the sensing apparatus 24 is coupled to a battery cell group container 54. In addition, the sensing apparatus 24 may include springs 56 with sensors 38 and/or 44 attached to the springs 56 to monitor the battery cell group 22. Specifically, when the battery cell group 22 is inserted into the battery cell group container 54, the springs 56 may be compressed and the sensors 38 and/or 44 may be held in contact with the cells 26 by the compression of the springs 56. Similar to the embodiments described above, the embodiment depicted in FIG. 6, may also be able reduce the cost and the complexity of manufacturing. Specifically, the sensing apparatus 24 is located separate from the cell terminals 28 and 30, which enables the bus bars 34 to be welded across the terminals 28 and 30. In some embodiments, the sensing apparatus 24 may be coupled to the battery cell group container 54 after manufacturing by an adhesive. Again, this enables added flexibility to choosing and adding sensing apparatuses 24 to a battery cell group 22.

Figure 7:
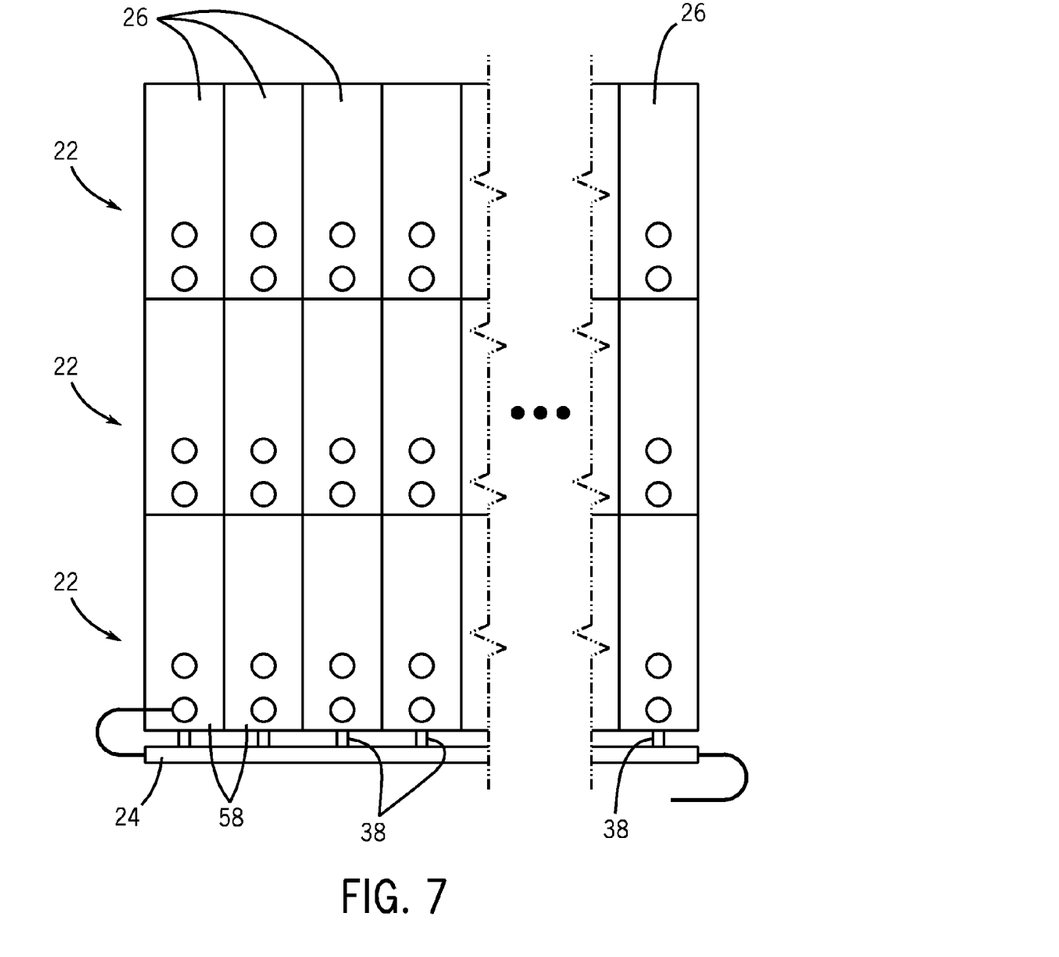
FIG. 7 is a schematic view of battery cell groups in parallel with a sensing apparatus according to one embodiment.

FIG. 7 illustrates a schematic view of the sensing apparatus 24 monitoring an alternate embodiment of the battery cell groups 22. In addition to the embodiments described above, the techniques described herein may be used in parallel battery cell groups 22. In the illustrated embodiment, each battery cell group 22 is organized horizontally. Battery cell groups 22 may be configured in parallel to supply voltage to high capacity systems. For example, in the depicted embodiment, the three vertical cells 26 connected in parallel in groups forms a virtual cell 58. If thirty-six cells 26 are connected in parallel in groups of three, the result would be twelve virtual cells 58. As depicted, one voltage sensor 38 may be used to monitor the voltage across each virtual cell 58.

The disclosed techniques improve the longevity and reduce the manufacturing cost of the battery system 20. In particular, the disclosed techniques may improve the longevity of the battery system 20 by utilizing sensors, such as voltage sensors 38 and temperature sensors 44, to assist the battery management unit maintain substantially even voltage and/or temperature in each of the cells 26. In addition, the disclosed techniques may reduce manufacturing costs of the battery system by utilizing a sensing apparatus 24, such as the elongated substrate in the figures, separate from the cell terminals 28 and 30, which enables the bus bars 34 to be welded across the terminals 28 and 30.

Although various embodiments of a medical system and method have been disclosed herein, many modifications and variations will be apparent to those skilled in the art. It is to be understood that embodiments according to the present disclosure may be embodied other than as specifically described herein. The invention is also defined in the following claims.

What is claimed:

1. A sensing apparatus configured to be used with a battery system comprising a plurality of battery cells, wherein each of the plurality of battery cells comprises a terminal on a respective first side configured to be electrically connected to a bus bar and the sensing apparatus comprises:
    an elongated substrate configured to extend along a respective second side of each of the plurality of battery cells, wherein the respective second side is different from the respective first side; and
    a plurality of voltage sensors coupled to the elongated substrate, wherein each of the plurality of voltage sensors is configured to directly contact a surface on the respective second side of a respective one of the plurality of battery cells to facilitate determining voltage across the respective one of the plurality of battery cells.

2. The sensing apparatus of claim 1, wherein the sensing apparatus comprises an additional voltage sensor configured to be coupled to a negative terminal of an end cell of the plurality of battery cells.

3. The sensing apparatus of claim 2, wherein:
    the additional voltage sensor is configured to measure voltage at the negative terminal of the end cell; and
    one of the plurality of voltage sensors is configured to measure voltage at a positive terminal of the end cell.

4. The sensing apparatus of claim 1, wherein each voltage sensor of the plurality of voltage sensors is configured to measure a first voltage at a contact point with the surface of the respective one of the plurality of battery cells to facilitate determining a second voltage across the respective one of the plurality of battery cells.

5. The sensing apparatus of claim 1, comprising a plurality of temperature sensors configured to facilitate determining temperature of each battery cell of the plurality of battery cells.

6. The sensing apparatus of claim 5, wherein the plurality of temperature sensors comprise thermistors or thermocouples.

7. The sensing apparatus of claim 1, wherein the elongated substrate is configured to be adhesively coupled to the plurality of battery cells.

8. The sensing apparatus of claim 1, comprising a plurality of springs, wherein each voltage sensor of the plurality of voltage sensors is coupled to a respective one of the plurality of springs.

9. The sensing apparatus of claim 8, wherein the elongated substrate is configured to be coupled to a container configured to hold the plurality of battery cells.

10. A battery system configured to provide motive power to an automotive vehicle, the battery system comprising:
    a first battery cell group comprising:
        a first plurality of battery cells, wherein each battery cell of the first plurality of battery cells comprises a positive terminal and a negative terminal on a first side of the first battery cell group; and
        one or more bus bars each welded to the positive terminal or the negative terminal of a respective one of the plurality of battery cells; and
    a sensing apparatus comprising:
        an elongated substrate extending along a second side of the first battery cell group; and
        a plurality of sensors coupled to the elongated substrate, wherein the plurality of sensors directly contact a first surface on the second side of the first battery cell group to facilitate determining voltage across one or more of the first plurality of battery cells.

11. The battery system of claim 10, comprising a second battery cell group electrically coupled to the first battery cell group, wherein:
    the first plurality of battery cells are electrically connected in parallel to form a first virtual battery cell; and
    the second battery cell group comprises a second plurality of battery cells electrically connected in parallel to form a second virtual battery cell.

12. The battery system of claim 11, wherein the plurality of sensors comprises:
    a first sensor that directly contacts the first surface on the second side of the first battery cell group to facilitate determining voltage across the first virtual battery cell; and
    a second sensor that directly contacts a second surface on a third side of the second battery cell group to facilitate determining voltage across the second virtual battery cell.

13. The battery system of claim 10, comprising a battery container configured to house the first battery cell group.

14. The battery system of claim 13, wherein the sensing apparatus is coupled to the battery container.

15. A method comprising:
    connecting a bus bar to a terminal on a respective first side of each battery cell of a plurality of battery cells to facilitate forming a battery cell group; and
    coupling a sensing apparatus comprising a plurality of voltage sensors along a respective second side of each of the plurality battery cells such that each voltage sensor of the plurality of voltage sensors directly contacts a surface on the respective second side of a respective one of the plurality of battery cells to facilitate determining voltage across the respective one of the plurality battery cells.

16. The method of claim 15, wherein connecting the bus bar to the terminal of each battery cell of the plurality of battery cells comprises welding the bus bar to the terminal of each battery cell of the plurality of battery cells.

17. The method of claim 15, wherein coupling the sensing apparatus along the respective second side comprises adhesively coupling the sensing apparatus to the battery cell group.

18. The method of claim 15, wherein the sensing apparatus comprises a plurality of springs, wherein each spring of the plurality of springs is coupled to one of the plurality of voltage sensors.

19. The method of claim 18, wherein coupling the sensing apparatus along the respective second side comprises compressing the plurality of springs by pushing the battery cell group against the plurality of springs.

20. The method of claim 19, wherein compressing the plurality of springs comprises placing the battery cell group into a container that has the sensing apparatus coupled to an interior surface of the container.

* * * * *